US009025630B2

(12) United States Patent
Gerard et al.

(10) Patent No.: US 9,025,630 B2
(45) Date of Patent: May 5, 2015

(54) ON-CHIP ELECTRICALLY PUMPED OPTICAL PARAMETRIC SOURCE (71) Applicant: Commissariat a l'Energie Atomique et Aux Energies Alternatives, Paris (FR)

(72) Inventors: Jean-Michel Gerard, Saint Martin d'Uriage (FR); Giuseppe Leo, Fontenay sous Bois (FR); Alessio Andronico, Charenton le Pont (FR); Sara Ducci, Paris (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/279,762

(22) Filed: May 16, 2014

(65) Prior Publication Data
US 2014/0341245 A1  Nov. 20, 2014

(30) Foreign Application Priority Data
May 16, 2013 (FR) ...................................... 13 54413

(51) Int. Cl.
H01S 5/00 (2006.01)
H01S 5/34 (2006.01)
H01S 5/022 (2006.01)
H01S 5/06 (2006.01)

(52) U.S. Cl.
CPC . H01S 5/34 (2013.01); H01S 5/022 (2013.01); H01S 5/0604 (2013.01); H01S 5/3412 (2013.01)

(58) Field of Classification Search
USPC ...................... 372/43.01, 44.01, 45.01, 46.01
See application file for complete search history.

(56) References Cited

U.S. PATENT DOCUMENTS

| 2005/0121678 | A1* | 6/2005 | Ezaki et al. | 257/79 |
| 2007/0104443 | A1 | 5/2007 | Helmy | |
| 2012/0183009 | A1* | 7/2012 | Adachi et al. | 372/99 |
| 2012/0230361 | A1* | 9/2012 | Adachi et al. | 372/45.01 |

FOREIGN PATENT DOCUMENTS

| EP | 1 089 405 | 4/2001 |
| FR | 2 894 396 | 6/2007 |

OTHER PUBLICATIONS

Search Report as issued for French Patent Application No. 1354413, dated Feb. 28, 2014.
Tong, C., et al., "Characteristics of Edge-Emitting Bragg Reflection Waveguide Lasers," IEEE Journal of Quantum Electronics, vol. 46, No. 11, Nov. 2010, pp. 1605-1610.
(Continued)

Primary Examiner — Dung Nguyen
(74) Attorney, Agent, or Firm — Pillsbury Winthrop Shaw Pittman LLP (57) ABSTRACT A tuneable laser source includes a first confinement layer forming a Bragg reflector for a pump wave; an active layer made of non-linear semiconducting material, the refraction index of the active layer being greater than the refraction index of the first confinement layer; a second confinement layer, the refraction index of the second confinement layer being less than the refraction index of the active layer; a base with a first width; and a ribbon with a second width less than the first width. The second width is less than 10 µm; the active layer includes at least one plane of quantum boxes capable of emitting a pump wave and the ribbon includes at least the part of the active layer including the quantum boxes plane and the second confinement layer.

15 Claims, 7 Drawing Sheets

(56) References Cited

OTHER PUBLICATIONS

Abolghasem, P., et al., "Single-sided Bragg reflection waveguides with multilayer core for monolithic semiconductor parametric devices," J. Opt. Soc. Am. B, vol. 29, No. 6, Jun. 2012, pp. 1367-1375.

Bijlani, B.J., et al., "Intracavity Parametric Fluorescence in Diode Lasers," OSA/CLEO, 2011, 2 pgs.

* cited by examiner

ON-CHIP ELECTRICALLY PUMPED OPTICAL PARAMETRIC SOURCE

CROSS-REFERENCE TO RELATED APPLICATIONS

This application claims priority to French Patent Application No. 1354413, filed May 16, 2013, the entire content of which is incorporated herein by reference in its entirety.

FIELD

The technical field of the invention is compact coherent optical sources with tuneable wavelength.

This invention relates to an on-chip electrically pumped optical parametric source and particularly a semiconducting laser diode capable of emitting tuneable infrared radiation by intra-cavity parametric generation.

BACKGROUND

The range of the electromagnetic spectrum in the near infrared within the range of wavelengths between 1 and 3 µm, plays a key role in the current socio-economic context. It is at the heart of communications on optical fibers and is frequently used in many applications related to detection of polluting gases and to safety. Consequently, attempts have been made for several years to find tuneable optical sources within this range of wavelengths, and with electrical pumping to guarantee compactness and ease of use. Semiconducting sources available at the present time (laser diodes, quantic cascade lasers) have very limited tunability based on control by temperature and/or injection current. For example, temperature tunability without mode skip of a DFB (Distributed Feedback Laser) is about 6 nm in the case of an InGaAsP diode within the telecom band (for a temperature excursion $\Delta T$ of about 50° C.), about 3 nm in the case of an InGaAsSb diode close to 2 µm (for a temperature excursion $\Delta T$ of about 13° C.), and about 20 nm for an InGaAs/AlAsSb cascade laser close to 3.35 µm (for a temperature excursion $\Delta T$ of about 90° C.).

An alternative approach to obtain a bright and tuneable coherent light source consists of making an electrically pumped Optical Parametric Oscillator (OPO). The basic principle of such a device is to use a semiconducting laser component emitting at a pump frequency $\omega p$ to parametrically generate radiation with two complementary frequencies, a signal frequency $\omega s$ and a complementary frequency $\omega c$, satisfying the equation $\omega s+\omega c=\omega p$, making use of the non-linear properties of the semiconducting material forming the laser.

Figure 1A:
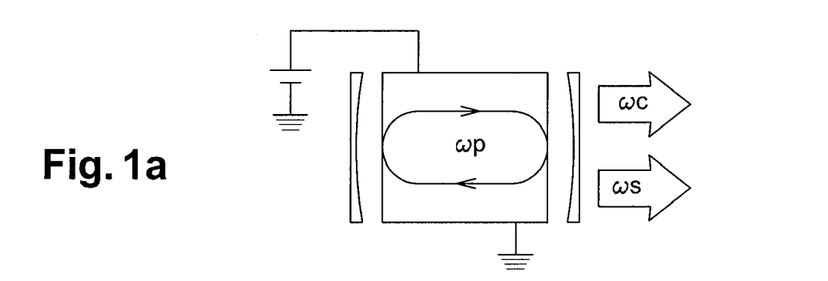
FIG. 1a diagrammatically shows operation of a laser-OPO.

If a cavity is defined for radiation at the signal frequency $\omega s$ and/or at the complementary frequency $\omega c$, the component is genuinely an OPO. The OPO threshold above which the component emits two coherent light beams with signal frequency $\omega s$ and complementary frequency $\omega c$ is reached for a given pump power at pump frequency $\omega p$. Throughout the remainder of this description we will call this component a "laser-OPO". Its operating principle is shown in FIG. 1a.

Figure 1B:
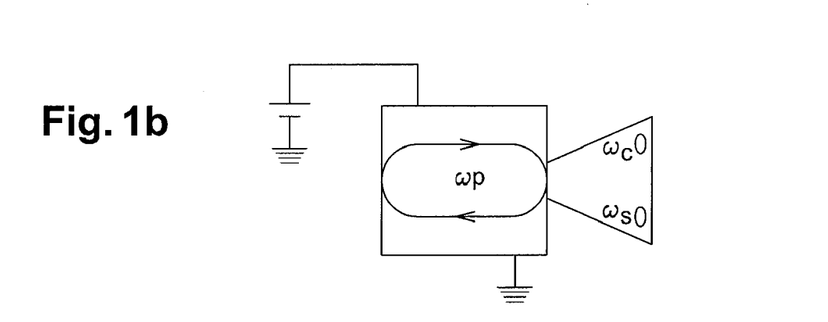
FIG. 1b diagrammatically shows operation of a twin-photon source.

If no cavity is defined at the signal frequency $\omega s$ and/or at the complementary frequency $\omega c$, or if the OPO threshold is not reached, the component emits pairs of photons by parametric fluorescence at signal frequency $\omega s$ and complementary frequency $\omega c$ simultaneously with very strong quantic correlations. It is well known that these pairs of so-called "twin" photons are very useful in the field of quantic communications, quantic information processing and metrology. In the following, we will refer to this component as "electrically pumped twin-photon source". Its operating principle is shown in FIG. 1b.

Figure 1C:
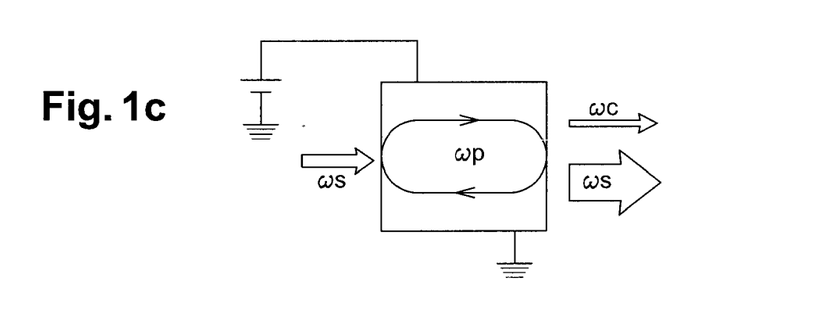
FIG. 1c diagrammatically shows operation of an optical parametric amplifier at a signal frequency ωs and of a frequency translator from the signal frequency ωs to a complementary frequency ωc.

Other functions may be performed starting from a laser-OPO structure making use of parametric generation. For example, consider a laser-OPO above the laser threshold at the pump frequency $\omega p$, but below the OPO threshold. If a coherent beam at the signal frequency $\omega s$ is optically injected into the component, optical parametric oscillation can be triggered and an amplified coherent beam at the signal frequency $\omega s$, together with a coherent beam at the complementary frequency $\omega c$, can be obtained. This component then acts as an amplifier at the signal frequency $\omega s$, and as a frequency translator from the signal frequency $\omega s$ to the complementary frequency $\omega c$. Its operating principle is shown in FIG. 1c.

A major difficulty that has prevented the fabrication of an on-chip electrically pumped optical parametric oscillator in the past is namely obtaining the "phase-matching" condition between the different beams. If the parametric generation is to be efficient, the phase mismatch between the optical modes involved has to be cancelled. In the case of parametric fluorescence at degeneracy, in which a pump photon at the pump frequency $\omega p$ is split into two photons with the same energy, a signal photon at the signal frequency $\omega s$ and a complementary photon at the complementary frequency $\omega c$ according to the equation $\omega s=\omega c=\omega p/2$, it corresponds to the condition $n(\omega p)=n(\omega p/2)$, where $n(\omega)$ is the refraction index of a material at frequency $\omega$.

In the general case, the frequency triplet should satisfy the following two conditions:

Energy conservation: $\omega p=\omega s+\omega c$

Phase matching: $\omega p * n(\omega p)=\omega s * n(\omega s)+\omega c * n(\omega c)$ In a solid medium, phase matching is prevented by chromatic dispersion (refraction index increases as a function of the frequency). Phase matching can only be achieved in particular materials with optical birefringence, which makes it possible to achieve equality between indexes of two different polarisation modes. This birefringent phase matching is not possible in optically isotropic solid crystals such as gallium arsenide GaAs.

Confinement of pump, signal and complementary beams by wave guide provides new means of satisfying the phase-matching condition. Propagation of different guided modes is characterised by a specific effective index for each mode, and the effective index of a high order mode is lower than the index of the fundamental guided mode (at a given frequency $\omega$). It then becomes possible to compensate for the effect of chromatic dispersion by this modal dispersion effect. By confining the beams, the waveguides provide better coverage of the three waves and a more efficient parametric generation.

In addition, III-V semiconducting waveguides widely used in optoelectronics have important additional benefits:
- micro and nanoelectronic technologies enable very advanced engineering of optical heterostructures and high-level perfection of structures made;
- the non-resonant quadratic non-linearity of these structures may have very high values due to the high value of the non-linear coefficient of GaAs in the near infrared ($d_{14}=100$ µm/V);
- III-V semiconducting materials have good thermal and mechanical properties and can resist very high optical intensities.

In this context, A. Helmy discloses a method in document US2007/0104443 to obtain phase matching between different waves in a waveguide. According to this method, phase matching is obtained by combining the Total Internal Reflection (TIR) phenomenon with two Distributed Bragg Reflectors (DBR). Throughout the remainder of this document, the method disclosed in document US2007/0104443 is referred to as the "DBR-TIR" method.

Figure 2:
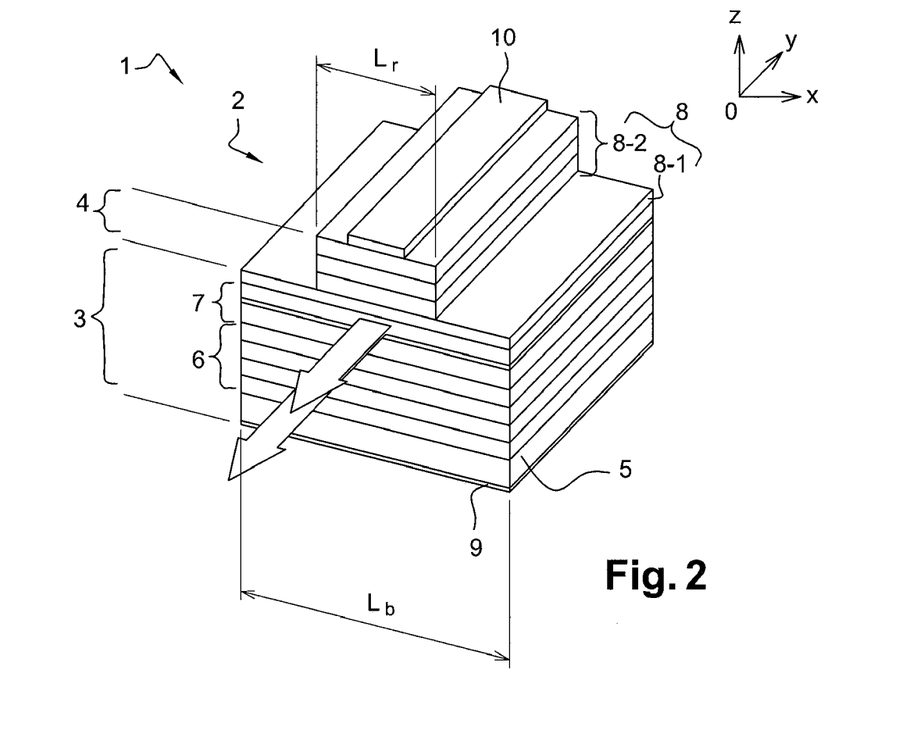
FIG. 2 diagrammatically shows a parametric fluorescence laser diode according to the state of the art.

Up to now, the DBR-TIR method has been the only method that has experimentally demonstrated parametric fluorescence by intra-cavity generation in a quantum well laser diode. FIG. 2 thus shows a parametric fluorescence laser diode 1 presented in the "Intracavity Parametric Fluorescence in Diode Lasers" document by B. J. Biljani et al. (CLEO 2011 conference proceedings, article PDPA3). The parametric fluorescence laser diode 1 comprises a semiconductor heterostructure 2 with a base 3 and a ribbon 4.

The base 3 of the semiconductor heterostructure 2 extends in a reference plane Oxy. The base 3 has a width Lb measured along the Ox axis. The base 3 comprises the following layers stacked along an Oz axis:
- a semiconducting substrate 5 made of GaAs;
- a first super-lattice 6 extending along the semiconducting substrate 5. The first super-lattice 6 is formed by a periodic stack of GaAs and GaAlAs sub-layers acting as a Bragg reflector at the pump wavelength of 1 µm;
- a GaAlAs active layer 7 extending on the first super-lattice 6 and comprising multiple quantum wells, the multiple quantum wells emitting a pump wave at a pump wavelength of 1 µm;
- a first part 8-1 of a second super-lattice 8, the first part 8-1 extending on the active layer 7, the second super-lattice 8 comprising a periodic stack of GaAs and GaAlAs sub-layers acting as a Bragg reflector at the pump wavelength of 1 µm.

The ribbon 4 extends on the base 3 of the semiconductor heterostructure 2. The ribbon 4 has a width Lr that is measured along the Ox axis and is less than the width Lb of the base 3. The ribbon 4 comprises a second part 8-2 of the second super-lattice 8.

The first super-lattice 6 and the second super-lattice 8 provide vertical confinement of the pump wave by acting as Bragg reflectors at the pump wavelength. For signal and complementary wavelengths, the "Bragg reflector" effect is missing and vertical confinement of signal and complementary waves is achieved by total internal reflection. This is achieved by assuring that the first and second super-lattices 6 and 8 have a smaller average refraction index than the average refraction index of the active layer 7.

The parametric fluorescence laser diode 1 also comprises:
- a first electrical contact 9 extending under the substrate 5 of the base 3;
- a second electrical contact 10 extending on the ribbon 4.

However, such a device has serious limitations:
- it has a phase-matching condition that is extremely critical to obtain;
- it only allows weak temperature tunability of the signal and complementary wavelengths;
- it cannot achieve significant power levels, in other words of the order of a hundred nW, for signal and complementary wavelengths.

In particular, this structure could not reach the OPO oscillation threshold. All these limitations severely restrict prospects of an on-chip electrically pumped optical parametric oscillator.

The two first difficulties mentioned above are related to the need to have easily adjustable free parameters to satisfy firstly the phase-matching condition and secondly to obtain frequency tunability of the component. For example, consider operation of the OPO at degeneracy ($\omega s=\omega e=\omega p/2$). The solution obtained by solving the phase-matching equation, if there is a solution, is frequency $\omega p^{AP}$. It will be appreciated that the laser-OPO cannot function unless this frequency corresponds to the laser mode frequency. This is a genuine difficulty, because the phase-matching band is very narrow, typically of the order of 1 nanometer for GaAs/GaAlAs structures.

This point has important practical consequences because the laser-OPO fabrication process begins with epitaxial growth of the semiconductor heterostructure containing the active medium. After this first growth step, the spectral position of the gain curve for a given temperature is fixed, as is the position of its maximum that is close to laser mode. Therefore, there must be a control parameter that assures equality between the laser mode pump frequency $\omega p$ and the phase-matching frequency $\omega p^{AP}$.

The temperature T can be used as an adjustable parameter because it acts differently on the laser gain curve (and therefore on the pump frequency $\omega p$) and on the phase-matching frequency $\omega p^{AP}$. In practice, such a parametric component is usually installed on a base with controlled temperature that allows fine control of the phase-matching condition. For example, this base makes it possible to compensate for the temperature rise of the laser component in operation, which can potentially result in losing the phase matching. Temperature may also be used to confer some spectral tunability to the component. Starting from one possible operating point at temperature T defined by triplet of frequencies ($\omega p(T)$, $\omega s(T)$, $\omega c(T)$), where:
- $\omega p(T)$ is the laser pump frequency at temperature T;
- $\omega s(T)$ is the signal frequency at temperature T;
- $\omega c(T)$ is the complementary frequency at temperature T;

a change in the temperature T modifies the laser pump frequency and the effective indexes of the three modes. Consequently, phase matching will be obtained for different signal and complementary frequencies. Therefore, the temperature is a very useful parameter for fine control of the laser-OPO but it can only correct small deviations from the phase matching.

On the other hand, optical guidance inside a ribbon made by deep etching provides a very efficient degree of freedom to vary the phase matching. "Ribbon made by deep etching" means a structure by which modes are confined laterally by etched flanks of the ribbon. In a laser diode, this means that the active medium is located in the ribbon. The phase-matching condition can be very well controlled by simple variation of the width of the deeply etched ribbon, if it is sufficiently narrow, typically of the order of a few micrometers wide. The ribbon width is also a parameter that can easily be adjusted during fabrication of the component, and that can be defined very precisely.

However, in the case of a quantum well laser diode, the recombination of electron-hole pairs on the lateral surfaces of the etched ribbon has a very prejudicial effect on functioning of the component. Due to this constraint, the width of a ribbon is always at least a few tens of micrometers wide in practice. Consequently, the parametric fluorescence laser diode shown in FIG. 2 uses a shallow etched ribbon 4: the active layer 7 is not in the ribbon 4 but is in the base 3. Shallow etching is sufficient to laterally localise modes, but it only has a very small effect on the effective indexes of the three modes and consequently on the phase-matching frequency at degeneracy $\omega p^{AP}$. More precisely, a variation of 3 to 5 µm in the ribbon width is not sufficient to shift $\omega p^{AP}$ by more than 2 nm in the case of the structure studied by Biljani et al, while a shift of more than 20 nm could be obtained with the same structure if deep etching of the ribbon were possible.

This small margin in varying $\omega p^{AP}$ is also the source of the second difficulty mentioned above: even if a phase-matching point is found, temperature tuning of the parametric process is impossible, and for example the signal frequency $\omega s$ and the complementary frequency $\omega e$ cannot be changed while maintaining their sum constant because the temperature modifies the pump frequency $\omega p$. Using current injected into the laser as an adjustment variable is not a good idea either, for at least two reasons:

a) the variables I and T are related;
b) it is desirable that the power emitted by a photonic device can be modified independently of its wavelength.

The third difficulty is related to the large series resistance of the experimental device used, as shown in FIG. 2. This large series resistance is itself due to band discontinuities in the bi-layers that form the distributed Bragg reflectors DBR, and to the thickness of these reflectors. One variant of this experimental device consists of replacing the upper distributed Bragg reflector by a total internal reflection confinement cladding. Such a modification provides a means of dividing the series resistance of the component by 2 but does not completely eliminate the problem. In the remainder of this document, this variant that combines a single distributed Bragg reflector with the total internal reflection phenomenon will be denoted by the abbreviation "SS-BRW".

SUMMARY

An aspect of the invention provides a solution to the problems mentioned above, by making it possible to make an on-chip electrically pumped optical parametric oscillator. In particular, depending on its operating mode, a structure conforming with an embodiment of the invention can be used as a laser-OPO, as a twin-photon source or as an optical parametric amplifier at the signal frequency and frequency translator from the signal frequency to the complementary frequency.

To achieve this, an embodiment of the invention proposes to use one or several quantum box planes instead of quantum wells, as the gain medium. Trapping of electron-hole pairs in quantum boxes effectively limits their lateral diffusion. It then becomes possible to make narrow deep-etched ribbon lasers a few micrometers wide, in other words comprising the gain medium, without their performances being penalised by the non-radiative recombination of carriers on the etched edges of the ribbon. This major modification solves the three problems mentioned above, in the context of fabrication of an optical parametric oscillator.

An aspect of the invention essentially concerns an electrically pumped tuneable laser source comprising:
a first optical confinement layer extending along an Oxy reference plane and forming a distributed Bragg reflector for a pump wave at a pump wavelength;
an active layer made of non-linear semiconducting material extending on the first optical confinement layer, the average refraction index of the active layer being greater than the average refraction index of the first optical confinement layer;
a second optical confinement layer extending on the active layer, the average refraction index of the second optical confinement layer being less than the average refraction index of the active layer; the laser source comprising:
a base with a first width along an Ox axis;
a ribbon extending on the base, the ribbon having a second width along an Ox axis less than the first width;

the second width being less than 10 µm, the active layer comprising at least one plane of quantum boxes capable of emitting a pump wave at a pump wavelength and the ribbon comprising at least:
the part of the active layer comprising the quantum boxes plane;
the second optical confinement layer;
the ribbon enabling emission, by parametric conversion from the pump wave, of two waves, respectively called the "signal wave" and the "complementary wave", the second width being chosen to match the phase between the pump wave, the signal wave and the complementary wave.

Due to the use of a gain medium comprising quantum boxes and a narrow ribbon comprising at least the second optical confinement layer and the active region, an embodiment of the invention considerably improves optical confinement of laser mode (pump mode of the optical parametric oscillator) and signal and complementary modes. A "narrow ribbon" means a ribbon with a width of less than 10 µm. "Average refraction index" means the average value of a refraction index in a given volume. All refraction indexes are calculated at a wavelength equal to twice the pump wavelength. Furthermore, in a structure according to an embodiment of the invention, effective indexes become much more sensitive to the ribbon width. This results in a reduction of the laser current, in an increase in the signal and complementary power, in a phase-matching condition that is much easier to achieve and in an increased wavelength tunability. The fact that the active layer is in the narrow ribbon also makes it possible to place the lower contact on the front face of the base with lateral injection of carriers.

Apart from the characteristics mentioned above in the previous paragraph, the laser source according to an embodiment of the invention may have one or several complementary characteristics among the following characteristics considered individually or in any technically possible combinations:

In the quantum boxes plane, the density of quantum boxes is between 1 box/µm² and 1000 boxes/µm². This density of quantum boxes is beneficially between 100 boxes/µm² and 1000 boxes/µm² so as to achieve the oscillation threshold of the laser-OPO (shown in FIG. 1a) or to increase the signal and complementary powers of a twin-photon source (shown in FIG. 1b), of an optical parametric amplifier or of a frequency translator (shown in FIG. 1c).

When the active layer comprises several quantum box planes, the space between two consecutive quantum box planes is between 10 nm and 40 nm. Beneficially, the space between two consecutive quantum box planes is of the order of 20 nm.

The ribbon may beneficially comprise the entire active layer so as to improve the pump mode confinement factor in the active region.

The ribbon may beneficially comprise part of the first optical confinement layer so as to improve the pump mode confinement factor in the active region.

The laser source has a length along an Oy axis perpendicular to the Ox axis that is between 100 µm and 5 mm. Thus, the length will be beneficially adjusted to optimise operation of the pump laser and the frequency conversion efficiency, depending on losses in pump, signal and complementary modes.

The second optical confinement layer beneficially forms a distributed Bragg reflector for the pump wave at the pump wavelength. Thus, the second optical confinement layer contributes to vertical confinement of the pump wave at the pump wavelength.

In an embodiment targeting the production of a laser source according to the invention and operating as an optical parametric oscillator, the ribbon comprises a first dielectric mirror on its first output facet and a second dielectric mirror on its second output facet in order to reflect the signal wave and/or the complementary wave and/or the pump wave. These dielectric mirrors beneficially reduce optical losses at signal and/or complementary wavelengths and lower the threshold of the optical parametric oscillator.

In another embodiment targeting the production of a laser source according to the invention and functioning as a twin-photon source, the ribbon comprises, for the signal wave and the complementary wave, an optical layer with low reflectivity on its first output facet and an optical layer with high reflectivity on its second output facet. The optical layer with low reflectivity on the first output facet beneficially facilitates extraction of pairs of twin-photon.

The laser source is electrically pumped to guarantee compactness and ease of use.

In a laser source conforming with an embodiment of the invention:
the base comprises a top face on which the ribbon is supported, and a bottom face,
the ribbon comprises a bottom face in contact with the top face of the base, and a top face.

In a first embodiment of the invention, the laser source comprises:
a first electrical contact placed on the top face of the ribbon;
a second electrical contact placed on the bottom face of the base.

According to this first embodiment of the invention:
the laser source is doped with a first type of doping starting from the bottom face of the base on which the second electrical contact is placed and as far as the active layer, and possibly in part of the active layer adjacent to the first optical confinement layer, and not further than the quantum boxes plane, including the quantum boxes plane;
the laser source is doped with a second type of doping opposite the first type of doping starting from the top face of the ribbon on which the first electrical contact is placed, throughout the second optical confinement layer and as far as the active layer, and possibly in part of the active layer adjacent to the second optical confinement layer, and not further than the quantum boxes plane, including the quantum boxes plane.

Thus, electrical conduction is beneficially facilitated by one type of carrier on the active layer side, and by the other type of carrier on the side opposite the active layer.

In a second embodiment of the invention, the laser source comprises:
a first electrical contact placed on the top face of the ribbon;
a second electrical contact placed on part of the top face of the top sub-layer of the base.

This second embodiment beneficially avoids electron transport through the entire first optical confinement layer. This benefit becomes even more important for a structure for which the second optical confinement layer does not comprise a distributed Bragg reflector. In such a structure, not all of the current passes through the single distributed Bragg reflector, located in the first optical confinement layer and that plays a key role for confinement of pump mode and to obtain the phase matching.

According to this second embodiment of the invention:
the laser source is doped with a first type of doping at least from the top sub-layer of the base on which the second contact is placed and as far as the active layer.
the second optical confinement layer is doped with a second type of doping opposite the first type of doping.

Electrical conduction is thus beneficially facilitated by one type of carrier on one side of the active layer, and by the other type of carrier on the side opposite the active layer.

In an embodiment, the following are injected according to these first and second embodiments and for a structure with two Bragg reflectors:
electrons through the first electrical contact;
holes through the second electrical contact.

Beneficially, the following are injected according to these first and second embodiments and for a structure with a single Bragg reflector in the first optical confinement layer:
holes through the first electrical contact;
electrons through the second electrical contact.

Thus in all cases, the series resistance of the device is beneficially reduced because it is more difficult to transport holes than electrons through a Bragg reflector, because their effective mass is higher.

According to any one of embodiments of the invention, a laser source is beneficially supported on a base that is used to control its temperature. Temperature is an adjustable parameter that acts differently on the laser gain curve and therefore on the pump frequency, and on the phase-matching frequency. Such a base is very useful for fine control of the laser source.

The laser source beneficially emits radiation in a wavelength range between 1 μm and 3 μm. The wavelength range between 1 and 3 μm is at heart of communications on optical fibers and is frequently used in many applications related to the detection of polluting gases and in the safety field. Therefore a laser source conforming with an embodiment of the invention beneficially provides an optical source tuneable within this wavelength range.

If the laser source emits radiation within a wavelength range between 1 μm and 3 μm, the pump wave is beneficially emitted by a GaAs active layer comprising at least one plane of InAs quantum boxes.

An aspect of the invention also relates to a laser source fabrication process comprising:
epitaxial growth on a substrate extending along an Oxy reference plane of a semiconductor heterostructure comprising at least the following layers in this order starting from the substrate:
a buffer layer;
a first optical confinement layer forming a distributed Bragg reflector for a pump wave at a pump wavelength;
an active layer made of optically non-linear semiconducting material, the average refraction index of the active layer being greater than the average refraction index of the first optical confinement layer, the active layer comprising at least one plane of quantum boxes capable of emitting the pump wave at the pump wavelength;
a second optical confinement layer, the average refraction index of the second optical confinement layer being less than the average refraction index of the active layer;
etching of a ribbon along an Oz direction in the semiconductor heterostructure, at least in the second optical confinement layer and in the part of the active layer comprising the quantum boxes plane, the width of the ribbon being less than 10 μm.

The invention and its different applications will be better understood after reading the following description and examining the figures accompanying it.

BRIEF DESCRIPTION OF THE FIGURES

The figures are presented for guidance and are in no way limitative of the invention.

DETAILED DESCRIPTION

Unless mentioned otherwise, a particular element appearing in the different figures will have a single reference.

In this description, we describe in detail purely for illustrative purposes a parametric source structure according to an embodiment of the invention. This structure is designed to operate as an optical parametric oscillator (OPO) with a pump wave at a pump wavelength of 0.95 μm, and in degenerated mode, in other words with a signal wavelength and a complementary wavelength equal to 1.9 μm.

The structure described herein can give a compact laser source tuneable within a wavelength range of between 1 micrometer and 3 micrometers.

Figure 3A:
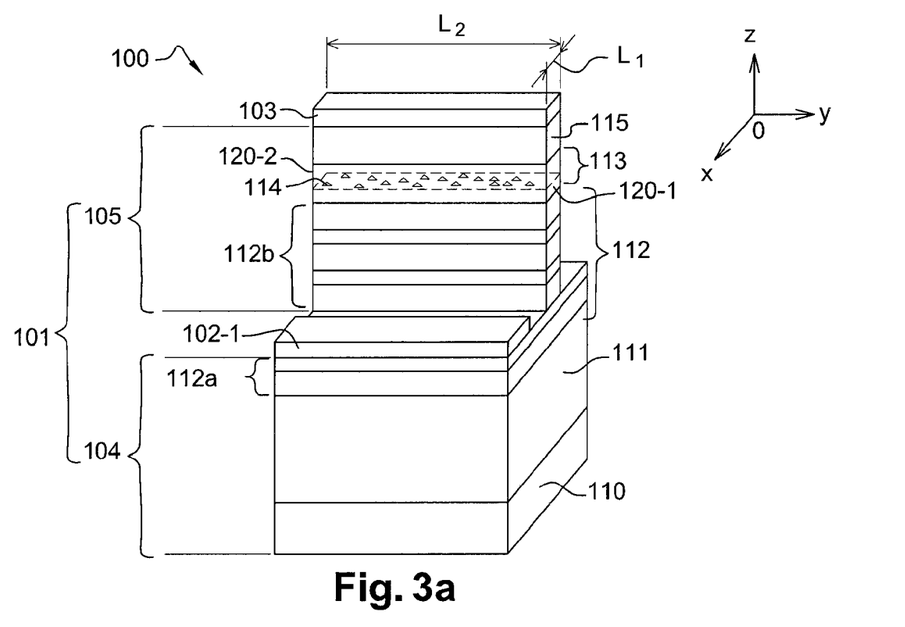
FIG. 3a diagrammatically shows a parametric source according to a first embodiment of the invention.

FIG. 3a diagrammatically shows a laser source 100 according to a first embodiment of the invention.

The laser source 100 according to an embodiment of the invention simultaneously performs:

the laser diode function for a pump wave at a pump frequency ωp;

the function of an optical parametric oscillator emitting a signal wave at the signal frequency ωs and a complementary wave also called the "idler" at the complementary frequency ωc, by parametric conversion from the pump wave at the pump frequency ωp.

The pump wave at the pump frequency ωp is generated within the laser source 100 by an active medium comprising one or several planes of semiconducting quantum boxes.

The geometry of the laser source 100 is the geometry of a laser diode with emission by the edge and with ribbon defined by deep etching. This ribbon provides lateral confinement of the pump, signal and complementary waves at frequencies ωp, ωs and ωc. The pump wave at frequency ωp is confined vertically on the substrate side by a distributed Bragg reflector.

The laser source 100 comprises:
a semiconductor heterostructure 101;
a first electrical contact 102-1;
a second electrical contact 103.

The semiconductor heterostructure 101 comprises:
a base 104 extending along a reference plane Oxy;
a ribbon 105 extending on the base 104, the ribbon 105 having a width L1, measured along an Ox axis, of 3.5 μm and a length L2, measured along an Oy axis, of the order of 1 mm.

The base 104 comprises the following layers stacked along an Oz axis:
a semiconducting substrate 110;
a buffer layer 111 extending on the substrate 110;
a first part 112a of a first optical confinement layer 112, the first part 112a extending on the buffer layer 111.

The ribbon 105 comprises the following layers stacked along the Oz axis:
a second part 112b of the first optical confinement layer 112;
an active layer 113 comprising a quantum boxes plane 114, the active layer 113 extending on the second part 112b of the first optical confinement layer 112;
a second optical confinement layer 115 extending on the active layer 113.

The first optical confinement layer 112 is formed by a first periodic stack of sub-layers forming a distributed Bragg reflector for the pump mode at the pump frequency ωp. Thus, the first optical confinement layer 112 contributes to vertical confinement of the pump wave at the pump frequency ωp. The average refraction index of the first optical confinement layer 112 is less than the average refraction index of the active layer 113. Thus, the first optical confinement layer 112 contributes to vertical confinement of signal and complementary waves at frequencies ωs and we by total internal reflection.

In the example shown, the first optical confinement layer 112 is both in the base 104 with its first part 112a, and in the ribbon 105 with its second part 112b. Alternately, the first optical confinement layer may be entirely in the base 104 or entirely in the ribbon 105. Between these two extreme cases, the distribution of the periodic stack of sub-layers between the first and second parts 112a and 112b respectively belonging to the base 104 and to the ribbon 105, may vary.

According to the first embodiment shown in FIG. 3a, the laser source 100 comprises a first electrical contact 102-1 that extends on part of the upper surface of the base 104, in other words in the example shown on part of the upper surface of the first part 112a of the first optical confinement layer 112.

In this first embodiment, the first optical confinement layer 112 is doped, for example with type N doping:
at least in its second part 112b belonging to the ribbon 105, on which the active layer 113 is supported,
and in part of its first part 112a belonging to the base 104, on a part of which the first electrical contact 102-1 is supported.

The laser source 100 also comprises a second electrical contact 103 that extends over the top surface of the ribbon 105, in other words on the second optical confinement layer 115. The second optical confinement layer 115 is doped and its doping type is opposite to the doping type of the first optical confinement layer 112. If the first optical confinement layer 112 has N type doping, the second optical confinement layer will be P doped.

The second optical confinement layer 115 is a layer for which the average refraction index is less than the average refraction index of the active layer 113. Thus, the second optical confinement layer 115 contributes to the vertical confinement of signal and complementary waves at frequencies ωs and we by total internal reflection. According to one variant of the first embodiment, the second optical confinement layer 115 may contain a second periodic stack of sub-layers forming a distributed Bragg reflector for pump mode at the pump frequency ωp. Thus, the second optical confinement layer 115 contributes to vertical confinement of the pump wave at pump frequency ωp.

The active layer 114 of the ribbon 105 also has a first output facet 120-1 and a second output facet 120-2, extending along a plane Oxz, to the two ends of the active layer 114. The first and second output facets 120-1 and 120-2 in the example shown are processed by a dielectric multi-layer to give reflectivity of the order of 90% for the pump signal and for the complementary signal.

Figure 3B:
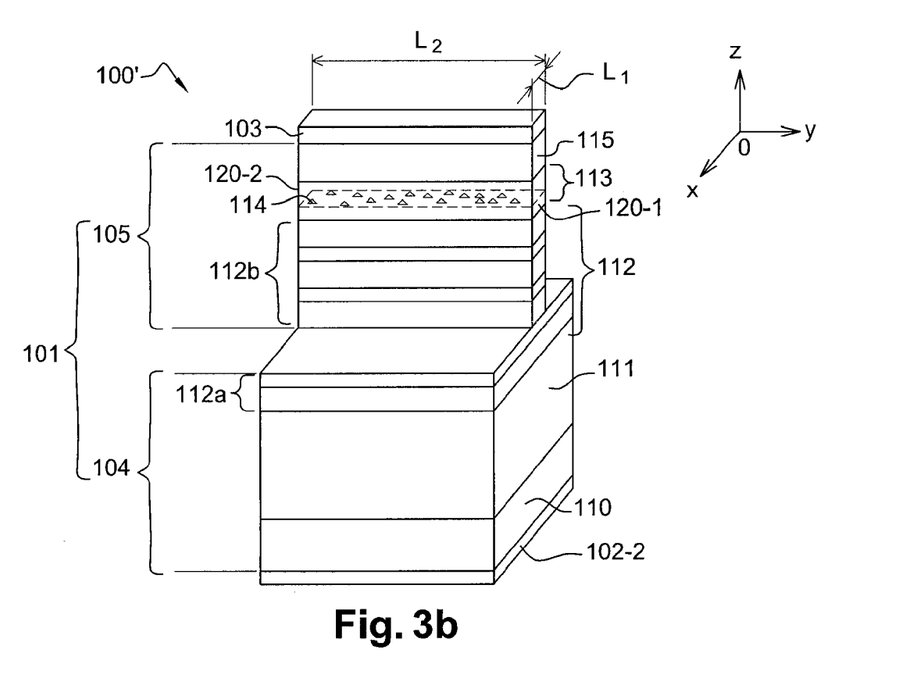
FIG. 3b diagrammatically shows a parametric source according to a second embodiment of the invention.

FIG. 3b diagrammatically shows a laser source 100' according to a second embodiment of the invention. According to this second embodiment, the laser source 100' comprises a first electrical contact 102-2 that extends under the bottom surface of the base 104.

According to this second embodiment in which the first electrical contact 102-2 is made under the bottom surface of the base 104, the substrate 110, the buffer layer 111 and the first optical confinement layer 112 are doped with the same nature of doping, for example an N type doping.

Figure 4:
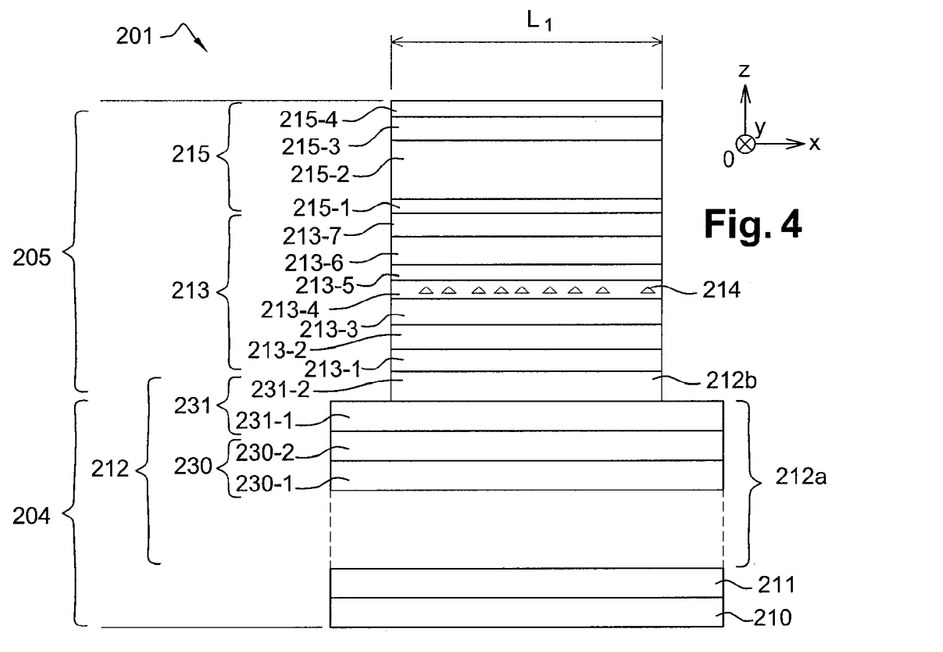
FIG. 4 diagrammatically shows a cross-section through a semiconductor heterostructure according to an embodiment of the invention.

FIG. 4 diagrammatically shows a section along an Oxz plane of a semiconductor heterostructure 201 according to an embodiment of the invention. We will now describe the composition and thickness of the layers of the semiconductor heterostructure 201 and their doping level when applicable. The structure shown in FIG. 4 is formed from materials in the family of III-V arsenide semiconductors for which the technological processes are very well controlled.

The semiconductor heterostructure 201 comprises:
a base 204 extending along a reference plane Oxy;
a ribbon 205 extending on the base 204, the ribbon 205 having a width L1 measured along an Ox axis.

The base 204 comprises the following layers stacked along an Oz axis:
a semiconducting substrate 210 made of GaAs;
a 500 nm thick buffer layer 211 made of GaAs;
a first part 212a of a first optical confinement layer 212, the first part 212a extending on the buffer layer 211.

The ribbon 205 comprises the following layers stacked along the Oz axis:
a second part 212b of the first optical confinement layer 212;
an active layer 213 extending on the second part 212b of the first optical confinement layer 212;
a second optical confinement layer 215 extending on the active layer 212.

The first optical confinement layer 212 comprises a stack of 6 GaAs/GaAlAs bilayers.

In the example shown, the first part 212a of the first optical confinement layer 212 comprises:
four first bilayers (not shown);
a fifth bilayer 230 identical to the first four bilayers not shown, comprising:

a 147 nm thick first layer 230-1 made of GaAs;
a 910 nm thick second layer 230-2 made of $Al_{0.6}Ga_{0.4}As$;
a 147 nm thick first layer 231-1 made of GaAs of a sixth bilayer 231.

The second part 212b of the first optical confinement layer 212 comprises a 910 nm thick second layer 231-2 made of $Al_{0.6}Ga_{0.4}As$.

The active layer 213 in the example shown in FIG. 4 comprises seven sub-layers:
a 30 nm thick first sub-layer 213-1 made of $Al_{0.1}Ga_{0.9}As$;
a 200 nm thick second sub-layer 213-2 made of gallium aluminium arsenide, for which the composition varies gradually and linearly between $Al_{0.1}Ga_{0.9}As$ and $Al_{0.3}Ga_{0.7}As$;
a 165 nm thick third sub-layer 213-3 made of $Al_{0.3}Ga_{0.7}As$;
a 12 nm thick fourth sub-layer 213-4 made of GaAs and comprising a plane of quantum boxes 214 made of indium arsenide InAs emitting close to 0.95 μm and acting as a gain medium;
a 13 nm thick fifth sub-layer 213-5 made of $Al_{0.3}Ga_{0.7}As$;
a 200 nm thick sixth sub-layer 213-6 made of gallium-aluminium arsenide, the composition of which varies gradually and linearly between $Al_{0.3}Ga_{0.7}As$ and $Al_{0.1}Ga_{0.9}As$;
a 185 nm thick seventh sub-layer 213-7 made of $Al_{0.1}Ga_{0.9}As$.

The second optical confinement layer 215 in the example shown in FIG. 4 comprises four sub-layers:
a 30 nm thick first sub-layer 215-1 made of gallium aluminium arsenide, for which the composition varies gradually and linearly between $Al_{0.1}Ga_{0.9}As$ and $Al_{0.8}Ga_{0.2}As$;
a 1425 nm thick second sub-layer 215-2 made of $Al_{0.8}Ga_{0.2}As$;
a 60 nm thick third sub-layer 215-3 made of gallium aluminium arsenide, for which the composition varies gradually and linearly between $Al_{0.8}Ga_{0.2}As$ and GaAs;
a 10 nm thick fourth sub-layer 215-4 made of GaAs.

Composition graduations in the second sub-layer 213-2 and the sixth sub-layer 213-6 of the active layer 213, and in the first sub-layer 215-1 and the third sub-layer 215-3 of the second optical confinement layer 215, facilitate transport of holes and electrons in the structure.

If a laser source according to an embodiment of the invention is to be fabricated later with a second electrical contact extending on part of the top surface of the base 204, in other words in the example shown on part of the top surface of the sub-layer 231-1, the semiconductor heterostructure 201 shown in FIG. 4 also has the following doping levels:
first N type doping with a density of $3 \times 10^{18}$ $cm^{-3}$ over a thickness of 362 nm from the first part 231-1 of the fifth bilayer 231;
second N type doping with a density of $10^{17}$ creover a thickness of 925 nm starting from the first doping and stopping between the second and third sub-layers 213-2 and 213-3 of the active layer 213;
third P type doping with a density of $10^{17}$ $cm^{-3}$ over a thickness of 335 nm extending on part of the sixth sub-layer 213-6 and on the seventh sub-layer 213-7 of the active layer 213 and on part of the first sub-layer 215-1 of the second optical confinement layer 215;
fourth P type doping with a density of $5 \times 10^{17}$ $cm^{-3}$ over a thickness of 625 nm starting from the third doping;
fifth P type doping with a density of $2 \times 10^{18}$ $cm^{-3}$ over a thickness of 885 nm starting from the fourth doping.

If a laser source according to an embodiment of the invention is to be fabricated later with a second electrical contact extending under the bottom surface of the base 204, the entire base 204 will need to be doped with N type doping.

Figure 5:
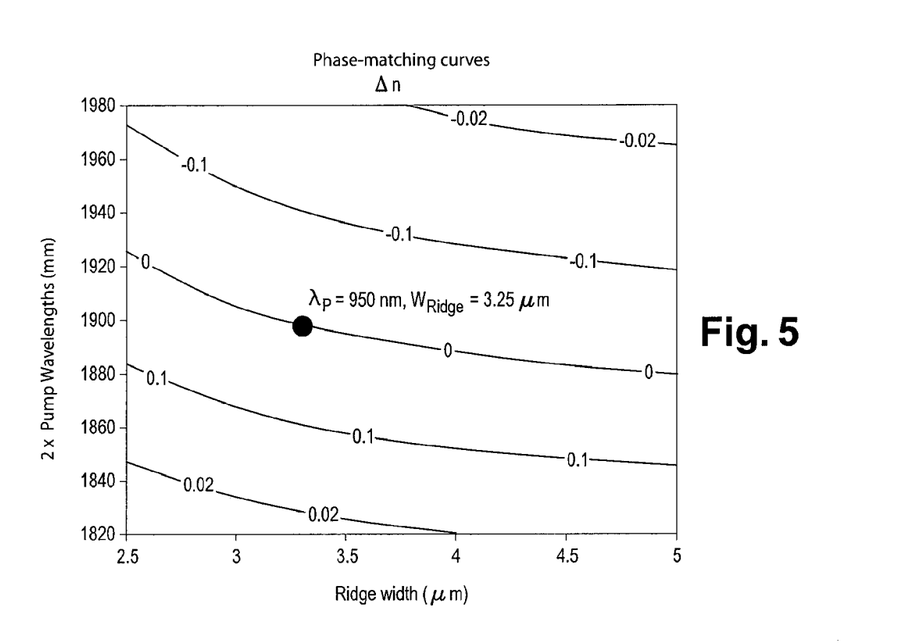
FIG. 5 shows phase-matching curves calculated for parametric generation at degeneracy in a device according to an embodiment of the invention.

FIG. 5 shows phase-matching curves calculated for parametric generation at degeneracy, in other words for a signal wave and a complementary wave at frequencies ωs and ωc such that ωs=ωc=ωp/2, where ωp is the pump wave frequency.

The shift Δn at phase matching is represented as a function of the ribbon width on the abscissa and in function of the wavelength of the pump beam on the ordinate, in which:

$$\Delta n = 2 * n_p(\omega p) - n_c(\omega c) - n_s(\omega s)$$

where:
- $n_p(\omega p)$ is the effective index of the pump mode at pump frequency ωp;
- $n_c(\omega c)$ is the effective index of the complementary mode at complementary frequency ωe;
- $n_s(\omega s)$ is the effective index of the signal mode at the signal frequency ωs.

FIG. 5 shows that the phase matching (Δn=0) for operation of the optical parametric oscillator at degeneracy and for a pump wavelength of 0.95 μm is obtained for a ribbon width of 3.25 μm. FIG. 5 demonstrates the considerable sensitivity of the phase-matching condition to the ribbon width. This high sensitivity will make it possible, if necessary, to correct deviations of a structure relative to the nominal structure shown in FIG. 4.

Figure 6:
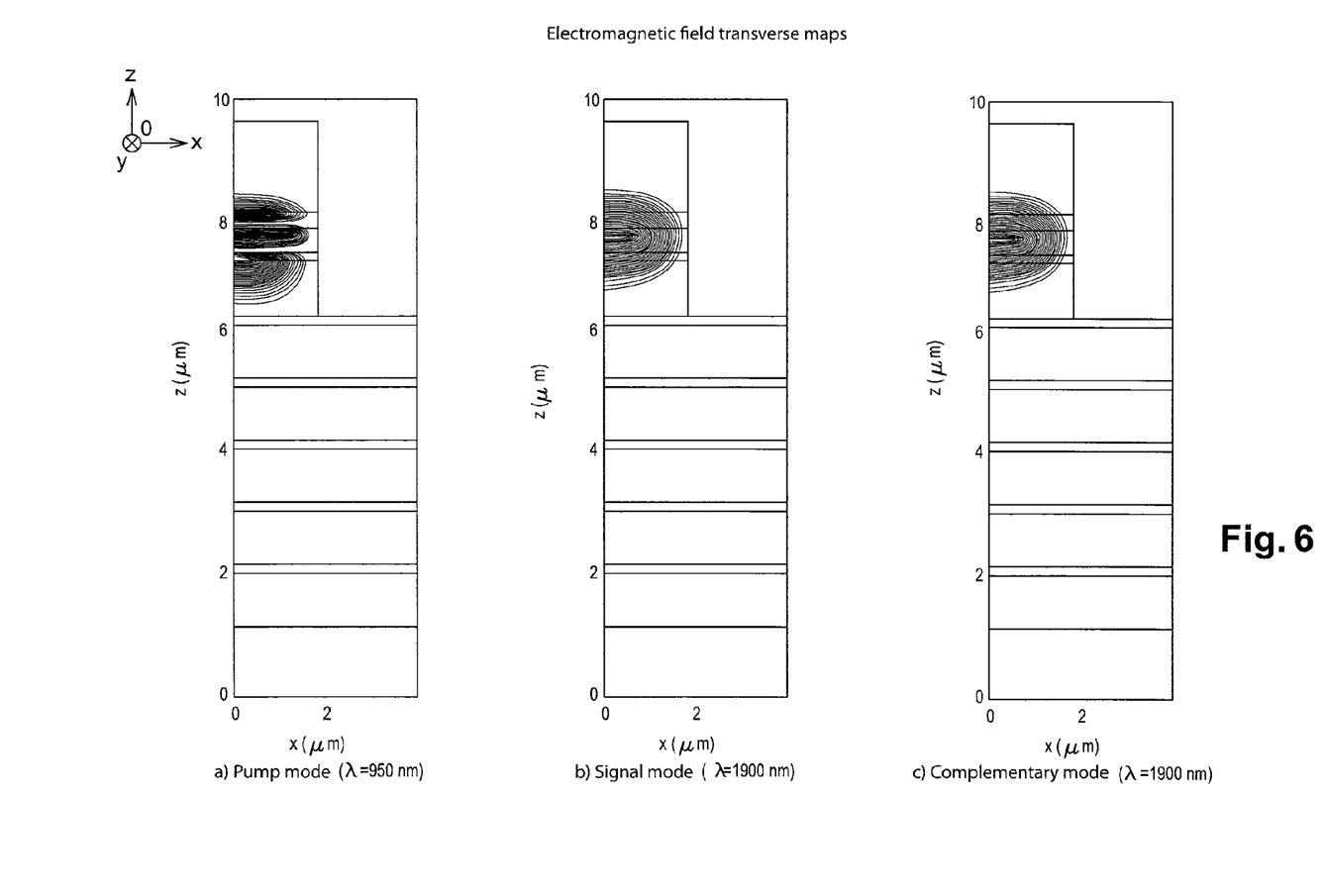
FIG. 6 shows transverse maps of the electromagnetic field associated with pump, signal and complementary modes generated by a device according to an embodiment of the invention.

FIG. 6 shows field maps for each of the following:
a) pump mode;
b) signal mode;
c) complementary mode.

FIG. 6 shows the excellent lateral confinement of these three modes by a ribbon according to the invention. These field maps are also characteristics of confinement by Bragg reflection for a pump beam, and by total internal reflection for signal and complementary beams.

Figure 7:
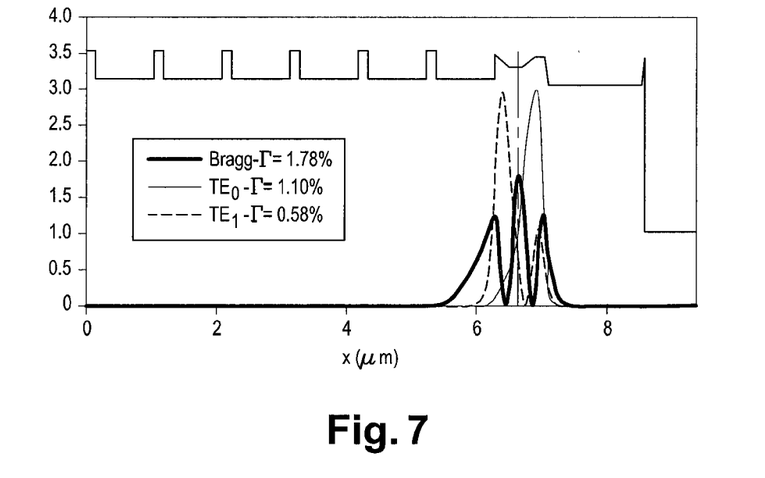
FIG. 7 shows the vertical profile of the first guided modes at the pump wavelength of 0.95 μm for a device according to an embodiment of the invention.

FIG. 7 shows the index profile associated with the heterostructure presented in FIG. 4, and the vertical profile of the field associated with the first three guided modes of the structure at the pump wavelength of 0.95 μm:
- the mode that is confined by Bragg reflection;
- the first transverse electric polarisation guided modes TE0 and TE1 that are confined by total internal reflection. This figure confirms that coupling of the quantum boxes, the position of which is indicated by the dashed vertical line, is better for the mode that is confined by Bragg reflection. Therefore, it is this mode that the structure will lase close to 0.95 μm, which is a condition to obtain phase matching.

A structure according to an embodiment of the invention may generally be applied to fabrication of a tuneable radiation source based on parametric generation of radiation at two complementary frequencies, inside the cavity of a laser diode in operation, making use of non-linear properties of the semiconducting material from which the laser is made. In particular, the functions of laser-OPO, source of twin-photons, optical parametric amplifier and frequency translator described above with reference to FIGS. 1a, 1b and 1c respectively, may be achieved.

Figure 8:
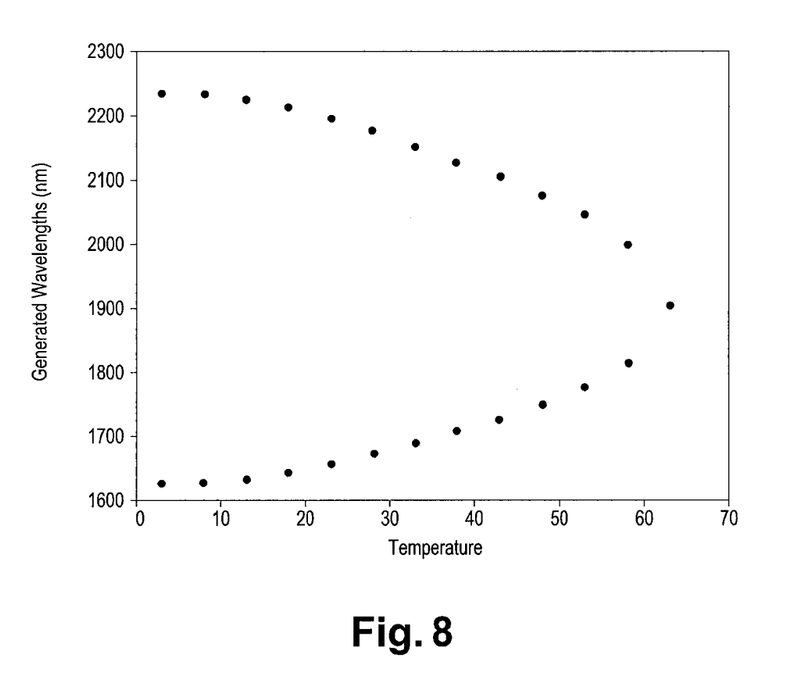
FIG. 8 is a graphic view showing the variation of wavelengths of the signal wave and of the complementary wave as a function of the temperature in a device according to an embodiment of the invention.

FIG. 8 shows the spectral tunability of a parametric source according to an embodiment of the invention, as it can be obtained by adjusting the temperature of the component. In this case, it will be seen that the pump wavelength is 953 nm, which can give operation of the component at degeneracy for a temperature of 63° C. It can be seen that when the temperature is varied between 3° C. and 63° C., the wavelengths of the signal wave and the complementary wave cover a very wide spectral range from 1620 nm to 2230 nm. In a particular embodiment of the invention, several sources made with different ribbon widths can be associated on the same substrate. This approach can cover an even wider spectral range by choosing:
- firstly, the source that will be electrically pumped, which enables the choice of a spectral range for the signal wave and/or the complementary wave;
- then the temperature which enables fine adjustment of the wavelength within the previously chosen spectral range.

FIGS. 9a to 9f show a method of fabricating a parametric source according to an embodiment of the invention. This fabrication process begins with epitaxial growth shown in FIG. 9a, of a semiconductor heterostructure on a crystalline substrate 300. This heterostructure comprises the following layers starting from the substrate:
- a buffer layer 301, that smoothes the surface of the sample at the beginning of growth;
- a first optical confinement layer 302 composed of a periodic stack of sub-layers forming a distributed Bragg reflector for the pump mode at the pump frequency ωp;
- an active layer 303 comprising at least one plane of quantum boxes acting as a gain medium at pump frequency ωp, the average refraction index of the active layer being greater than the average refraction index of the first optical confinement layer;
- a second optical confinement layer 304, composed either of a layer with an average refraction index less than the average refraction index of the active layer, or of a periodic stack of sub-layers forming a distributed Bragg reflector for pump mode at the pump frequency ωp, the stack having an average refraction index less than the average refraction index of the active layer.

Figure 9A:
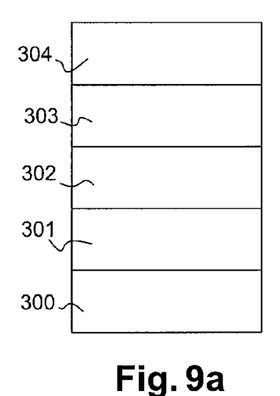
FIGS. 9a to 9f show different steps in a method of fabrication of a device according to an embodiment of the invention.

The fabrication process also comprises the following steps during growth:
- a doping step with a first type of doping, of the first optical confinement layer 302, at least in the sub-layer(s) close to the active layer 303;
- a doping step, with a second type of doping opposite the first type of doping, of the second optical confinement layer 304.

The subsequent steps in fabrication of the component are based on steps well known to those skilled in the art used for fabrication of etched ribbon laser diodes.

Figure 9B:
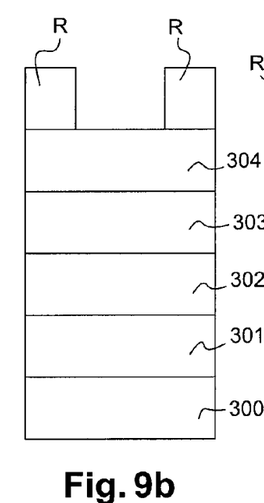
Figure 9C:
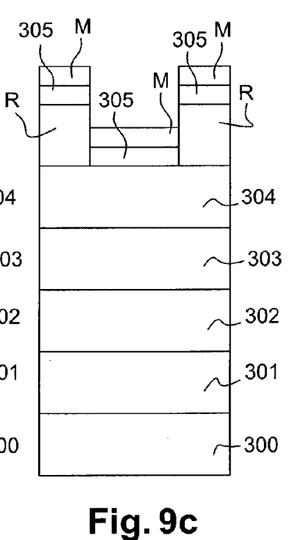
Figure 9D:
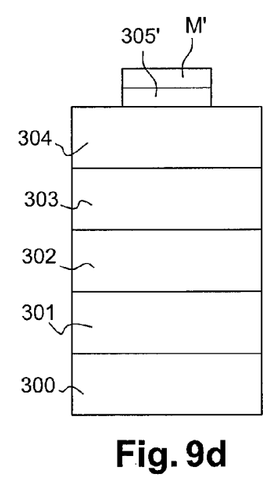
Figure 9E:
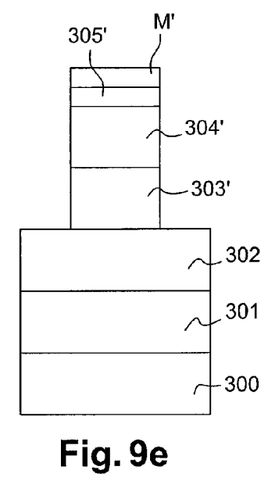

For example, the following protocol could be used:
- in FIG. 9b: deposit of a resin R followed by lithography to define holes in the resin at the future position of the ribbon;
- in FIG. 9c: deposit of a metallic layer 305 and a masking layer M acting as an etching mask on the resin R and on the surface of the second optical confinement layer 304 not covered with the resin R;
- in FIG. 9d: removal of the masking layer M and the metallic layer 305 by lift-off, except at the future position of the ribbon; a residual metallic layer 305' remains that will be used to form the first electrical contact, and an etching mask M';
- in FIG. 9e: definition of the ribbon by a step of etching the second optical confinement layer 304 and at least part of the active layer 303 comprising the quantum boxes plane. This step is made in an embodiment by dry etching, for example by reactive ion etching, to give good control of the ribbon width. A ribbon is obtained that is formed by an etched second optical confinement layer 304' and a partially or totally etched active layer 303'.

The ribbon thus formed contains the quantum boxes plane. Alternately, the first optical confinement layer 302 may also be entirely or partially etched.

Figure 9F:
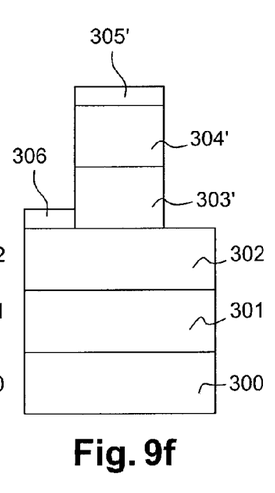

In FIG. 9f: removal of the etching mask M' and deposit of a metallic layer for definition of the second electrical contact 306. If the second contact is a lateral contact, the metal is deposited at the base of the etched ribbon on a non-etched doped sub-layer forming part of the first optical confinement layer 302 as shown in FIG. 9f, or alternately forming part of the buffer layer 301 in the case in which the first optical confinement layer 302 was entirely etched (case not shown). The position of this second contact 306 is defined by a new lithography step followed by lift-off;

thermal annealing of the sample to activate the two electrical contacts and to obtain good resistive behaviour;

definition of output facets, for example by cleavage, another option being to define them by etching at the same time as the ribbon;

possible deposition of mirrors or low reflectivity layers on output facets;

installation of the component on a base and making electrical contact using current input wires.

Throughout this description we have referred in preference to the generation of radiation in the infrared, within a wavelength range between 1 µm and 3 µm. However, a structure according to an embodiment of the invention can be envisaged in other spectral ranges. For example, two visible light beams could be parametrically generated within a laser diode based on gallium nitride GaN, of which the pump beam would be in the near UV, blue or green. Parametric generation within a laser diode based on indium phosphide InP, for which the wavelength of the pump beam would be between 1.3 µm and 2 µm, could also be envisaged.

The invention claimed is:

1. An electrically pumped tuneable laser source comprising:
    a first optical confinement layer extending along an Oxy reference plane and forming a distributed Bragg reflector for a pump wave at a pump wavelength;
    an active layer made of non-linear semiconducting material extending on the first optical confinement layer, the average refraction index of the active layer being greater than the average refraction index of the first optical confinement layer;
    a second optical confinement layer extending on the active layer, the average refraction index of the second optical confinement layer being less than the average refraction index of the active layer;
    a base with a first width along an Ox axis;
    a ribbon extending on the base, said ribbon having a second width along the Ox axis less than said first width, the second width being less than 10 µm;
    wherein the active layer comprises at least one plane of quantum boxes capable of emitting a pump wave at a pump wavelength;
    wherein the ribbon comprises:
        the part of the active layer comprising the quantum boxes plane;
        the second optical confinement layer;
    said ribbon enabling emission, by parametric conversion from the pump wave, of a signal wave and a complementary wave, the second width being selected to match a phase between the pump wave, the signal wave and the complementary wave.

2. The laser source according to claim 1, wherein in the quantum boxes plane, the density of quantum boxes is between 1 box/µm$^2$ and 1000 boxes/µm$^2$.

3. The laser source according to claim 1, wherein the ribbon comprises the entire active layer.

4. The laser source according to claim 1, wherein the ribbon further comprises a second part of the first optical confinement layer.

5. The laser source according to claim 1, wherein the laser source has a length along an Oy axis perpendicular to the Ox axis that is between 100 µm and 5 mm.

6. The laser source according to claim 1, wherein the second optical confinement layer forms a distributed Bragg reflector for the pump wave at the pump wavelength.

7. The laser source according to claim 1, wherein the ribbon comprises a first dielectric mirror on its first output facet and a second dielectric mirror on its second output facet in order to reflect the signal wave and/or the complementary wave and/or the pump wave.

8. The laser source according to claim 1, wherein the ribbon comprises, for the signal wave and the complementary wave, an optical layer with low reflectivity on its first output facet and an optical layer with high reflectivity on its second output facet.

9. The laser source according to claim 1, wherein:
    the base comprises a top face on which the ribbon is supported,
    the ribbon comprises a bottom face in contact with the top face of the base and a top face; and
    wherein the laser source comprises:
    a first contact placed on the top face of the ribbon;
    a second contact placed on part of the top face of the base.

10. The laser source according to claim 1 wherein:
    the base comprises a top face on which the ribbon is supported, and a bottom face,
    the ribbon comprises a bottom face in contact with the top face of the base and a top face; and
    wherein the laser source comprises:
    a first contact placed on the top face of the ribbon; and
    a second contact placed on the bottom face of the base.

11. The laser source according to claim 1, wherein the laser source is supported on a base that is used to control its temperature.

12. The laser source according to claim 1, wherein, in use, the laser source emits radiation in a wavelength range between 1 µm and 3 µm.

13. The laser source according to claim 12, wherein the pump wave is emitted by a GaAs active layer comprising at least one plane of InAs quantum boxes.

14. A process for fabrication of a laser source according to claim 1, comprising:
    performing an epitaxial growth on a substrate extending along an Oxy reference plane of a semiconductor heterostructure comprising at least the following layers in this order starting from the substrate:
        a buffer layer;
        a first optical confinement layer forming a distributed Bragg reflector for a pump wave at a pump wavelength;
        an active layer made of optically non-linear semiconducting material, the average refraction index of the active layer being greater than the average refraction index of the first optical confinement layer, said active layer comprising at least one plane of quantum boxes capable of emitting the pump wave at the pump wavelength;

a second optical confinement layer, the average refraction index of the second optical confinement layer being less than the average refraction index of the active layer;

etching a ribbon along an Oz direction in the semiconductor heterostructure, at least in the second optical confinement layer and in the part of the active layer comprising the quantum boxes plane, the width of said ribbon being less than 10 μm.

15. The laser source according to claim 2, wherein the density of quantum boxes is between 100 boxes/μm$^2$ and 1000 boxes/μm$^2$.

* * * * *